United States Patent
Lu

(10) Patent No.: US 8,373,218 B2
(45) Date of Patent: Feb. 12, 2013

(54) NITRIDE READ-ONLY MEMORY CELL AND METHOD OF MANUFACTURING THE SAME

(75) Inventor: Chi-Pin Lu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 12/914,043

(22) Filed: Oct. 28, 2010

(65) Prior Publication Data

US 2011/0042738 A1 Feb. 24, 2011

Related U.S. Application Data

(62) Division of application No. 11/649,902, filed on Jan. 5, 2007, now Pat. No. 7,834,382.

(51) Int. Cl.
*H01L 29/76* (2006.01)

(52) U.S. Cl. ........ 257/314; 257/315; 257/316; 257/324; 257/326

(58) Field of Classification Search .................. None
See application file for complete search history.

(56) References Cited

U.S. PATENT DOCUMENTS

| | | | |
|---|---|---|---|
| 5,840,607 A * | 11/1998 | Yeh et al. | 438/257 |
| 5,869,359 A | 2/1999 | Prabhakar | |
| 6,297,092 B1 | 10/2001 | Rudeck et al. | |
| 2004/0033678 A1* | 2/2004 | Arghavani et al. | 438/510 |
| 2004/0070020 A1* | 4/2004 | Fujiwara et al. | 257/314 |
| 2006/0281257 A1* | 12/2006 | Moon | 438/261 |

FOREIGN PATENT DOCUMENTS

| | | |
|---|---|---|
| TW | 200402834 A | 2/2004 |
| TW | 200531220 A | 9/2005 |

* cited by examiner

*Primary Examiner* — Kyoung Lee
(74) *Attorney, Agent, or Firm* — Bacon & Thomas, PLLC

(57) ABSTRACT

A nitride read-only memory cell and a method of manufacturing the same are provided. First, a substrate is provided, and a first oxide layer is formed on the substrate. Next, a nitride layer is deposited on the first oxide layer via a first gas and a second gas. The flow ratio of the first gas to the second gas is 2:1. After that, a second oxide layer is formed on the nitride layer. Then, a bit-line region is formed at the substrate. Afterward, a gate is formed on the second oxide layer. The first oxide layer, nitride layer, the second oxide layer and the gate compose a stack structure of the cell. Further, a spacer is formed on the side-wall of the stack structure.

11 Claims, 4 Drawing Sheets

NITRIDE READ-ONLY MEMORY CELL AND METHOD OF MANUFACTURING THE SAME

CROSS REFERENCE TO RELATED APPLICATIONS

This application is a divisional application of co-pending U.S. patent application Ser. No. 11/649,902, filed on Jan. 5, 2007 and entitled "Nitride Read-Only Memory Cell And Method of Manufacturing The Same".

BACKGROUND OF THE INVENTION

1. Field of the Invention

The invention relates in general to a memory cell and a method of manufacturing the same, and more particularly to a nitride read-only memory cell and a method of manufacturing the same.

2. Description of the Related Art

Memory devices capable of storing non-volatile information such as read-only memory (ROM), programmable read-only memory (PROM), erasable programmable read-only memory (EPROM) and other advanced memory devices are now widely applied in computers, communication devices and electronic products. Of the memory devices, advanced memory devices include electrically erasable programmable read-only memory (EEPROM), flash EEPROM and nitride read-only memory, and so on. The nitride read-only memory cell unit, having the features of storing two bits of data in one cell unit, higher memory density and compactability with the manufacturing process of the complementary metal oxide semiconductor (CMOS), has become a focus in the application and development of memory devices.

Normally, the elements of nitride read-only memory are disposed in two different areas, the array area and the periphery area. The array area comprises several oxide/nitride/oxide (ONO) structures and gate structures as the nitride read-only memory cell units. A barrier diffusion layer separates each of the ONO structures. According to the nitride read-only memory cell unit, the barrier diffusion layer and the spacer are etched on the edge of the array area, such that contact holes are formed for electrically connecting corresponding cells. However, along with the advance in the technology related to the memory manufacturing process, the memory elements are gradually scaled down to 0.075 nanometers or even 0.045 nanometers. Consequently, shifts or biases are more likely to occur during the process of etching, causing errors or biases to the contact holes. The current practice is to change the material of the spacer from oxide to nitride to facilitate the process of self-align contact (SAC) etching.

However, when the material of the spacer is nitride, the threshold voltage of the cell increases. The higher the threshold voltage is, the higher the working voltage of the memory device will be, not only intensifying the damage of the bottom oxide but also increasing power consumption of the memory device, and further reducing the stability of the memory device during operation.

SUMMARY OF THE INVENTION

The invention is directed to a nitride read-only memory cell and a method of manufacturing the same. The nitride layer of the ONO structure is deposited under different gas flow ratios, such that the nitride read-only memory cell has the advantage of lowering the threshold voltage.

According to a first aspect of the present invention, a method of manufacturing nitride read-only memory cell is provided. First, a substrate is provided, and a first oxide layer is formed on the substrate. Next, a nitride layer is deposited on the first oxide layer via a first gas and a second gas, and the flow ratio of the first gas to the second gas is 2:1. Then, a second oxide layer is formed on the nitride layer. Afterwards, a bit-line region is formed at the substrate. A barrier diffusion layer separates each of the ONO structures. Further, a gate is formed on the second oxide layer. The first oxide layer, nitride layer, the second oxide layer and the gate compose a stack structure of the cell. After that, a spacer is formed on the side-wall of the stack structure.

According to a second aspect of the present invention, a nitride read-only memory cell is provided. The memory cell comprises a substrate, a stack structure, a gate and a spacer. The substrate has a bit-line region. The stack structure is disposed on the substrate, and the bit-line region is positioned at the two sides of the stack structure. The stack structure at least comprises several oxide layers and a nitride layer. The nitride layer is deposited between the oxide layers via a first gas and a second gas, and the flow ratio of the first gas to the second gas is 2:1. The gate is positioned at the top of the stack structure. The spacer is positioned at the side-wall of stack structure.

The invention will become apparent from the following detailed description of the preferred but non-limiting embodiment. The following description is made with reference to the accompanying drawings.

DETAILED DESCRIPTION OF THE INVENTION

The invention is exemplified by an embodiment disclosed below.

However, the invention is not limited thereto and is not for limiting the scope of protection of the embodiment of the invention either. Moreover, unnecessary elements are not illustrated in the embodiment, such that the characteristics of the technology of the invention are clearly illustrated.

Figure 1:
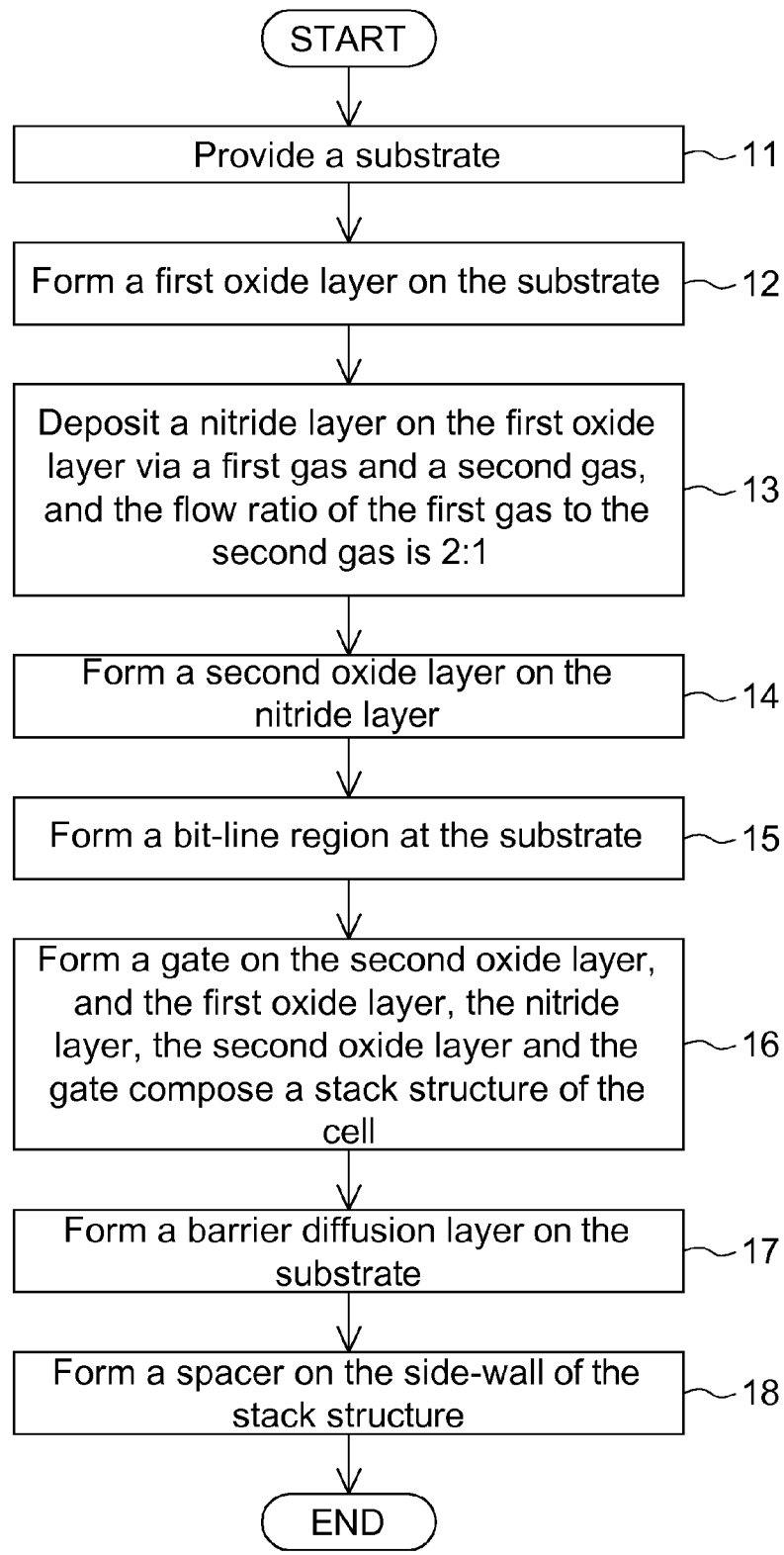
FIG. 1 is a flowchart of a method of manufacturing a nitride read-only memory cell according to the preferred embodiment of the invention.
Figure 2A:
FIG. 2A is a perspective of step 11 in FIG. 1.
Figure 2B:
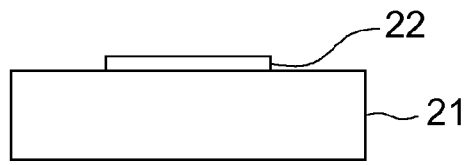
FIG. 2B is a perspective of step 12 in FIG. 1.
Figure 2C:
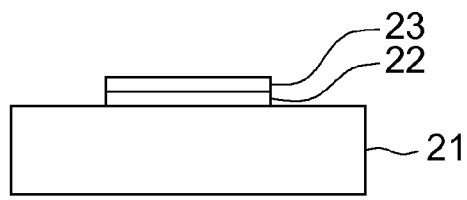
FIG. 2C is a perspective of step 13 in FIG. 1.
Figure 2D:
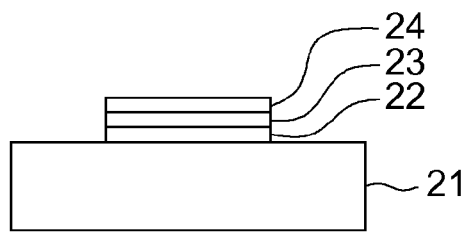
FIG. 2D is a perspective of step 14 in FIG. 1.
Figure 2E:
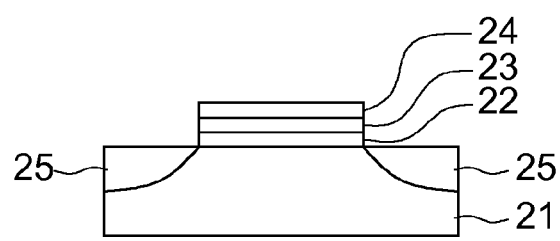
FIG. 2E is a perspective of step 15 in FIG. 1.
Figure 2F:
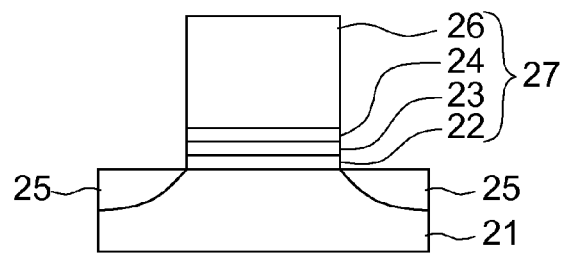
FIG. 2F is a perspective of step 16 in FIG. 1.
Figure 2G:
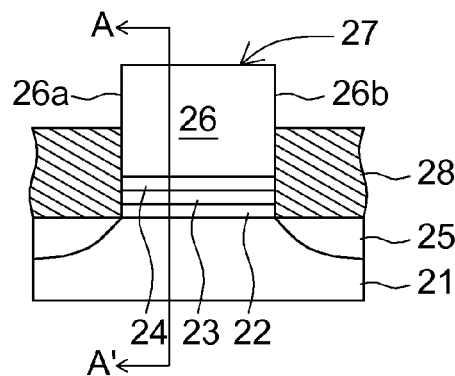
FIG. 2G is a perspective of step 17 in FIG. 1.
Figure 2H:
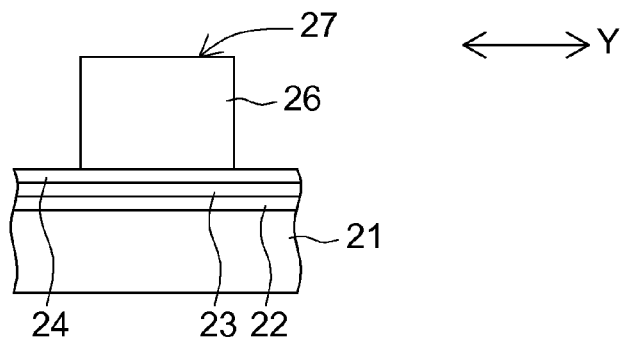
FIG. 2H is a perspective view of FIG. 2G along A-A'.
Figure 2I:
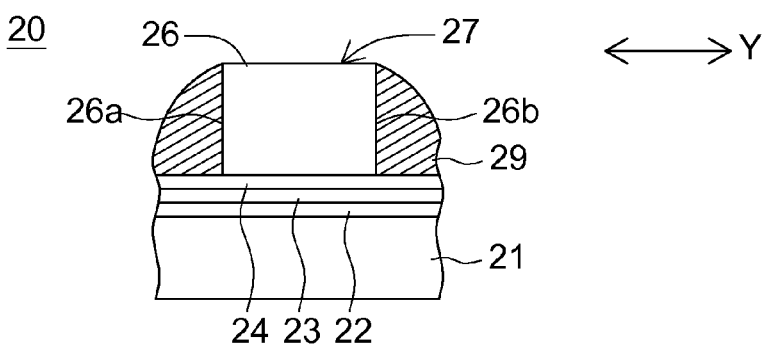
FIG. 2I is a perspective of step 18 in FIG. 1.

Referring to both FIG. 1 and FIGS. 2A~2I. FIG. 1 is a flowchart of a method of manufacturing a nitride read-only memory cell according to the preferred embodiment of the invention. FIGS. 2A~2G are perspectives of step 11~step 17 in FIG. 1. FIG. 2H is a perspective of FIG. 2G along A-A'. FIG. 2I is a perspective of step 18 in FIG. 1. First, the manufacturing method of the embodiment begins at step 11 and FIG. 2A, a substrate 21 is provided.

Next, the method proceeds to step 12, as indicated in FIG. 2B, a first oxide layer 22 is formed on the substrate 21. The first oxide layer 22 is deposited on the substrate 21 by way of wet oxidation. In an embodiment, the first oxide layer 22 has a thickness approximately equal to 48 angstroms (Å).

Afterward, the method proceeds to step 13, a deposition process is conducted via a first gas and a second gas. The flow ratio of the first gas to the second gas is 2:1. As indicated in FIG. 2C, a nitride layer 23 is deposited on the first oxide layer 22. In a preferred embodiment of the invention, the nitride layer 23 is deposited by way of low-pressure chemical vapor deposition via a 200 standard cubic centimeter per minute (SCCM) first gas and a 100 SCCM second gas under the conditions of 680° C. and 0.3 torr. Preferably, the first gas is dichlorosilane (DCS), the second gas is ammonia, and the nitride layer 23 is approximately deposited for a thickness of 70 Å.

As indicated in FIG. 2D, the method proceeds to step 14, a second oxide layer 24 is formed on the nitride layer 23. The second oxide layer 24 is deposited on the nitride layer 23 by way of chemical vapor deposition under the temperature of approximately 800° C., and the second oxide layer 24 is approximately deposited for a thickness of 90 Å. The first oxide layer 22, the nitride layer 23 and the second oxide layer 24 compose an ONO structure.

Afterward, the method proceeds to step 15, as indicated in FIG. 2E, a bit-line region 25 is formed at the substrate 21, preferably through ion implantation process, as a source and a drain of the cell.

Then, the method proceeds to step 16 and FIG. 2F, a gate 26 is formed on the second oxide layer 24. The first oxide layer 22, the nitride layer 23, the second oxide layer 24 and the gate 26 compose a stack structure 27. The bit-line region 25 is positioned at the two sides of the stack structure 27.

Next, the method proceeds to step 17, as indicated in FIG. 2G~2H, a barrier diffusion layer 28 is formed on the substrate 21. The barrier diffusion layer 28 is positioned at the side-wall of the stack structure 27, yet the barrier diffusuin layer 28 is not formed on the side-wall of the gate 26 in a direction Y. The direction Y, as indicated in FIG. 2H, is the bit-line direction.

Moreover, the method proceeds to step 18 and FIG. 2I, a spacer is formed at the two side walls 26a and 26b of the gate 26 in the direction Y.

According to the embodiment, the spacer 29 is preferably made from silicon nitride. The formation of the spacer 29 includes the following exemplifying steps. First, a silicon nitride layer (not illustrated in the diagram) is formed on the stack structure 27 through chemical vapor deposition. Then, the silicon nitride layer is patterned via photolithography and anisotropic etching, such that the spacer 29 is formed at the two side walls 26a and 26b of the gate 26 in the direction Y.

As indicated in FIG. 2I, which illustrates a nitride read-only memory cell structure according to a preferred embodiment of the invention, the cell structure 20 manufactured through the process from step 11~step 18 includes a substrate 21, a first oxide layer 22, a nitride layer 23, a second oxide layer 24, a gate 26, a barrier diffusion layer 28 (illustrated in FIG. 2G) and a spacer 29.

Figure 3A:
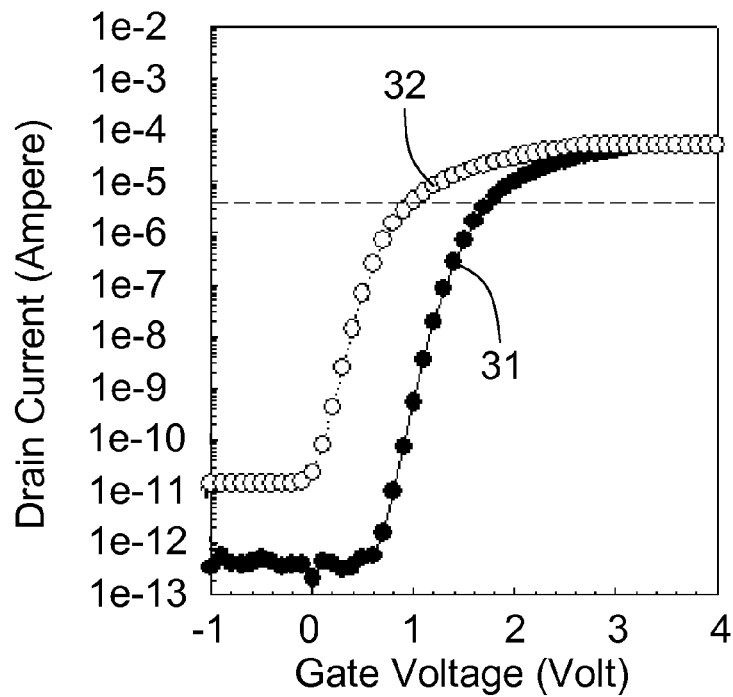
FIG. 3A is a diagram of threshold voltage characteristic curves of the cell when the nitride layer deposited under different flow conditions.

Referring to FIG. 3A, a diagram of threshold voltage characteristic curves of the cell when the nitride layer deposited under different flow conditions is shown. The curve 31 is a characteristic curve of the threshold voltage of a cell when the nitride layer 23 is deposited via a first gas and a second gas, and the flow ratio of the first gas to the second gas is 1:6. The curve 32 is a characteristic curve of the threshold voltage of a cell when the nitride layer 23 is deposited to form a silicon-rich silicon nitride layer between the first oxide layer 22 and the second oxide layer 24 (as indicated in FIG. 2H) via a first gas and a second gas, and the flow ratio of the first gas to the second gas is 2:1. When the drain current ($I_D$) is 5 micro-amperes, the gate voltage ($V_G$) corresponding to the curve 31 is approximately equal to 1.54V, and the gate voltage corresponding to the curve 32 is approximately equal to 0.89V. Thus, when the nitride layer 23 is deposited under the condition that the flow ratio of the first gas to the second gas is 2:1, the threshold voltage of the cell 20 can be reduced.

Figure 3B:
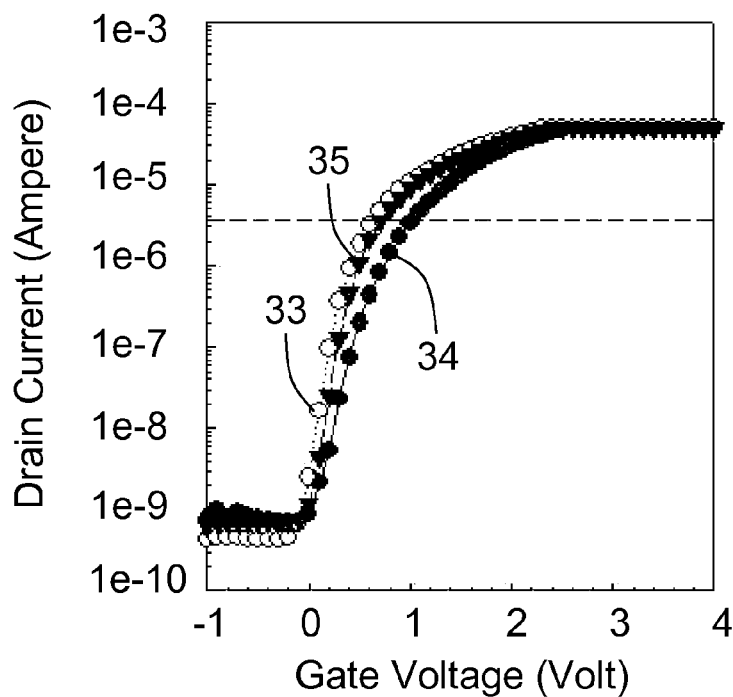
FIG. 3B is a diagram of threshold voltage characteristic curves of the cells having spacers and nitride layers made of different materials.

In addition, referring to FIG. 3B, a diagram of threshold voltage characteristic curves of the cells of spacers and nitride layers made of different materials is shown. The curve 33 and the curve 34 are threshold voltage characteristic curves of the cell 20 when the spacer 29 is respectively made of oxide and nitride. When the drain current is 5 micro-amperes, the gate voltage corresponding to the curve 33 is approximately equal to 0.71V, and the gate voltage corresponding to the curve 34 is increased to approximately 1.12V. The curve 35 is the characteristic curve of threshold voltage of cell 20 when the spacer 29 is made of nitride and when the nitride layer 23 is deposited under the condition that the flow ratio of the first gas to the second gas is 2:1. Under the same condition that the drain current is 5 micro-amperes, the gate voltage corresponding to the curve 35 is approximately equal to 0.79V. It would be noticeable from the curve 33, the curve 34 and the curve 35 that the threshold voltage of the cell 20 whose nitride layer 23 is deposited under the flow ratio of 2:1 and whose the spacer 29 is made of nitride is approximately the same with the threshold voltage of the cell 20 whose spacer 29 is made of oxide.

The above experimental results show that when the nitride layer 23 is deposited under the condition that the flow ratio of the first gas to the second gas is 2:1, the threshold voltage of the cell 20 is effectively reduced.

According to the nitride read-only memory cell and the method of manufacturing the same disclosed in the preferred embodiments of the invention, the second oxide layer is deposited on the nitride layer by way of high-temperature chemical vapor deposition and under the condition that the flow ratio of the first gas to the second gas is 2:1, such that the threshold voltage of the cell is effectively reduced. The above-described nitride read-only memory cell has several advantageous features. Under the current nitride read-only memory cell structure (that is, the structure of the cell is neither changed nor added), the invention decreases the threshold voltage of the cell without increasing manufacturing cost. Besides, the manufacturing method disclosed in the preferred embodiment of the invention is compactable with existing manufacturing process, therefore the nitride read-only memory cell can be manufactured without changing existing manufacturing process. Moreover, as the nitride read-only memory cell manufactured according to the preferred embodiments of the invention has lower threshold voltage, the cell maintains stability during operation.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A nitride read-only memory cell, comprising:
   a substrate having a bit-line region;

a stack structure disposed on the substrate, wherein the bit-line region is positioned at the two sides of the stack structure, the stack structure at least comprises:
a plurality of oxide layers;
a nitride layer disposed between the oxide layers, wherein the nitride layer is a silicon-rich nitride layer and formed by way of deposition via dichlorosilane (DCS) and ammonia, and the flow ratio of the DCS to the ammonia is 2:1; and
a gate disposed on the-top of the stack structure; and
a nitride spacer disposed on a side-wall of the stack structure.

2. The cell according to claim 1, wherein the flow of DCS is 200 SCCM, and the flow of ammonia is 100 SCCM.

3. The cell according to claim 1, wherein the oxide layers are a first oxide layer and a second oxide layer, the first oxide layer is disposed on the substrate, the nitride layer is disposed on the first oxide layer, the second oxide layer is disposed on the nitride layer, and the gate is disposed on the second oxide layer.

4. The cell according to claim 3, wherein the first oxide layer is formed on the substrate by way of wet oxidation, the second oxide layer is formed on the nitride layer by way of high-temperature chemical vapor deposition.

5. The cell according to claim 1, further comprises:
a barrier diffusion layer positioned at the side-wall of the stack structure.

6. The cell according to claim 5, wherein the nitride spacer is positioned at the two sides of the gate in the bit-line direction.

7. The cell according to claim 1, wherein the nitride spacer is made of silicon nitride.

8. The cell according to claim 1, wherein the first oxide layer has a thickness approximately equal to 48 Å.

9. The cell according to claim 1, wherein the nitride layer has a thickness approximately equal to 70 Å.

10. The cell according to claim 1, wherein the second oxide layer has a thickness approximately equal to 90 Å.

11. The cell according to claim 1, wherein the nitride spacer directly contacts the stack structure.

* * * * *